United States Patent [19]

Coppin

[11] Patent Number: 4,487,654
[45] Date of Patent: Dec. 11, 1984

[54] METHOD OF MANUFACTURING PRINTED WIRING BOARDS

[75] Inventor: James A. Coppin, Coquitlam, Canada

[73] Assignee: AEL Microtel Limited, Burnaby, Canada

[21] Appl. No.: 546,230

[22] Filed: Oct. 27, 1983

[51] Int. Cl.³ .................. C23F 1/02; C25D 5/02; C25D 5/34; B44C 1/22

[52] U.S. Cl. .................. 156/645; 29/852; 156/656; 156/659.1; 156/666; 156/90 Z; 204/15; 204/32.1; 427/97

[58] Field of Search .................. 204/15, 22, 24, 26, 204/32 R; 29/829, 840, 846, 852; 174/68.5; 427/96, 97; 156/150, 630, 634, 645, 656, 659.1, 666, 901, 902; 430/313, 315, 316, 318–319; 134/6, 7

[56] References Cited

U.S. PATENT DOCUMENTS 4,104,111  8/1978  Mack .................. 156/656
4,325,780  4/1982  Schulz .................. 29/852 X

OTHER PUBLICATIONS

Electronic Packaging and Production, Dec. 1982, Solder Coating and Leveling Competes with Tin–Lead Electroplate, H. W. Markstein, pp. 30–35.
Printed Circuit Fabrication, vol. 4, No. 8, Aug. 1981, Selective Solder Coating, C. R. Smith, Gyrex Corp., pp. 1–8.
Electronic Packaging and Production, Jan. 1979, PC Processing Using Solder Mask Over Tin–Nickel, E. F. Duffek, pp. 71–73.

Primary Examiner—William A. Powell
Attorney, Agent, or Firm—Russell A. Cannon

[57] ABSTRACT

An improved method of manufacturing a printed wiring board having the characteristics of one with a solder mask over bare copper for circuit traces and ground planes. The method includes the step of electroplating a very thin coating of tin–lead over the circuit traces, ground planes, holes and circuit pads prior to selectively coating only the pads and holes with a relatively thick coating of tin–lead solder plate. After removing the plating resist which defines the areas for selective solder coating, the board is chemically etched and then mechanically scrubbed to roughen the surface of and reduce the thickness of the thin solder plate. A solder mask may be applied over circuit traces and ground planes prior to reflowing the thick coating of solder plate. Assembled printed wiring boards may then be wave soldered without wrinkling of the solder mask.

23 Claims, 10 Drawing Figures

METHOD OF MANUFACTURING PRINTED WIRING BOARDS

BACKGROUND OF INVENTION

This invention relates to a method of manufacturing printed wiring boards with selective solder coating on circuit pads and holes, and more particularly to an improved method of obtaining a printed wiring board having the characteristics of one with a solder mask over bare copper.

A printed wiring board (PWB) or printed circuit board (PCB) is employed as a low cost vehicle for interconnecting various components in an electrical circuit. A simple printed wiring board can be made by applying a resist material to a copper foil that is cladded to a fiberglass core so as to define circuit patterns and chemically etching away unwanted copper foil. The particular method of applying the resist, the type of resist, and the type of etchant are process details that are dictated by the end requirements of the printed wiring board and the facilities that are available. In the manufacture of double sided PC boards, holes are drilled through the board and copper is plated into the holes for interconnecting copper foil on opposite sides of the board prior to forming circuit patterns in the foil. Circuit components are located on the boards, with leads extending through associated holes, prior to a mass soldering operation which may be wave soldering of the circuit board. The most commonly used solder is a tin-lead eutectic alloy of 63% tin and 37% lead which has a relatively sharp melting point of around 361° F. The operating temperature for associated wave soldering is somewhere in the range of 425°–525° F., with 490° F. being optimum. Poor solderability can take place at lower temperatures. Higher soldering temperatures can damage heat sensitive components, cause board warpage and/or cause excessive oxidation of molten solder. During wave soldering, undesirable side affects that may occur are excessive solder consumption, which increases the weight of the wiring board when large ground plane areas thereof become coated with solder, and a tendency for solder to bridge between circuit pads and traces as well as between adjacent circuit traces. In order to reduce the amount of solder that is applied to circuit areas such as ground planes and traces and the tendency for solder bridging, and to protect electrical circuitry from contamination, a solder mask or solder resist is often applied over bare copper circuit traces and bare ground planes. This resist is an organic coating that is applied over the entire board, except for windows around areas where a solder joint is required. This mask works well over bare copper traces and ground planes.

In order to improve solderability of circuit pads and holes, the practice is to precoat them with a solderable metal. The most desirable material for this application is an alloy of tin and lead which is similar to the eutectic alloy that is actually used in the subsequent mass-wave soldering operation. The tin-lead coating is generally electroplated onto the pads and in the holes and then reflowed. It may also be applied as a solder dip coating. Although other electro-deposited metals such as tin, nickel, tin-nickel alloy and even gold may be used to cover the copper foil-traces, solder plate is preferred due to its compatibility with the solder material used in wave soldering and the fact that it will melt during wave soldering and cause a liquid to liquid contact. Tin is next in preference with a melting point of only 450° F. Tin-nickel does not solder well and has a very high melting point which is much greater than that of tin-lead. Gold is cost prohibitive and a severe contaminant in the wave solder process, as well as causing brittle solder joints.

In the past, when a tin-lead solder overplating was used as an etch resist for the copper traces and ground planes and had a solder mask applied over it, the solder under the mask would melt and flow sufficiently during wave soldering to cause bridging of circuit traces under the solder mask as well as wrinkling and/or rupture of the solder mask itself. This problem is described in ones of the references "Solder Coating and Leveling Competes With Tin-Lead Electroplate" by H. W. Markstein, ELECTRONIC PACKAGING AND PRODUCTION, December 1982, pages 30–35; "Selective Solder Coating; Solving Your Customer's Problems" by C. R. Smith, PRINTED CIRCUIT FABRICATION, Vol. 4, No. 8, August 1981; "Processing Using Solder Mask Over Tin-Nickel" by E. F. Duffek, ELECTRONIC PACKAGING AND PRODUCTION, June 1979, starting on page 71; and U.S. Pat. No. 4,104,111, issued Aug. 1, 1978, "Process for Manufacturing Printed Circuit Boards" by R. L. Mack; which are incorporated herein by reference. This wrinkling is unattractive and subjects the mask to peeling and cracking which allows acid based flux to attack the circuit patterns and reduces the mask's affect as a conformal coating that is employed to protect the circuit from the elements, e.g., high humidity and corrosive atmospheres. The basic problem then is to produce a circuit board that solders well and has a solder mask that will not wrinkle during a wave solder operation.

One approach is to apply the solder mask over bare copper traces and ground planes. Another prior art technique is to chemically remove any tin-lead solder overplating from copper traces and ground planes prior to application of the solder mask, as is described in the Smith and Markstein articles. This adds the cost of an additional removal operation to the manufacture of the circuit board as well as the problem of removing lead from waste products. Another prior art technique is to overplate the copper of the circuit patterns with a high melting point metal, i.e., a tin-nickel alloy, and then selectively plate tin-lead solder on only the areas of holes and pads, the solder mask being applied over the tin-nickel on the traces and ground planes. Since the melting point of the tin-nickel overplate is much greater than that of the molten solder in the wave soldering operation, the tin-nickel does not melt and there is no deformation of the solder mask. This prior art technique is well described in the patent and Duffek article. Unfortunately, this prior art technique burdens a PC board manufacturer with the expense and Environmental Protection Agency requirements of having an additional plating bath for tin-nickel in his facility and his employing an additional step in the manufacturing operation, something that PC board manufacturers have been reluctant to do, as is documented in the Smith article.

An object of this invention is the provision of an improved method of manufacturing printed wiring boards.

SUMMARY OF THE INVENTION

In accordance with this invention, an improvement in a method of fabricating a printed circuit having a solder mask over at least a portion of other than pads and holes therethrough of a prescribed electrical circuit pattern in conductive material on the circuit board comprises the step of providing, on at least some of the portion of the conductive material, a thin coating of metallic etch resist which is a tin-lead solder alloy and is of a thickness that is insufficient for it to significantly reflow at the temperature of solder used in a subsequent operation such as wave soldering of the PC board assembly; the tin-lead etch resist not being chemically removed from said portion of the conductive material prior to its being covered by the solder mask.

DESCRIPTION OF PREFERRED EMBODIMENTS

Figure 1:
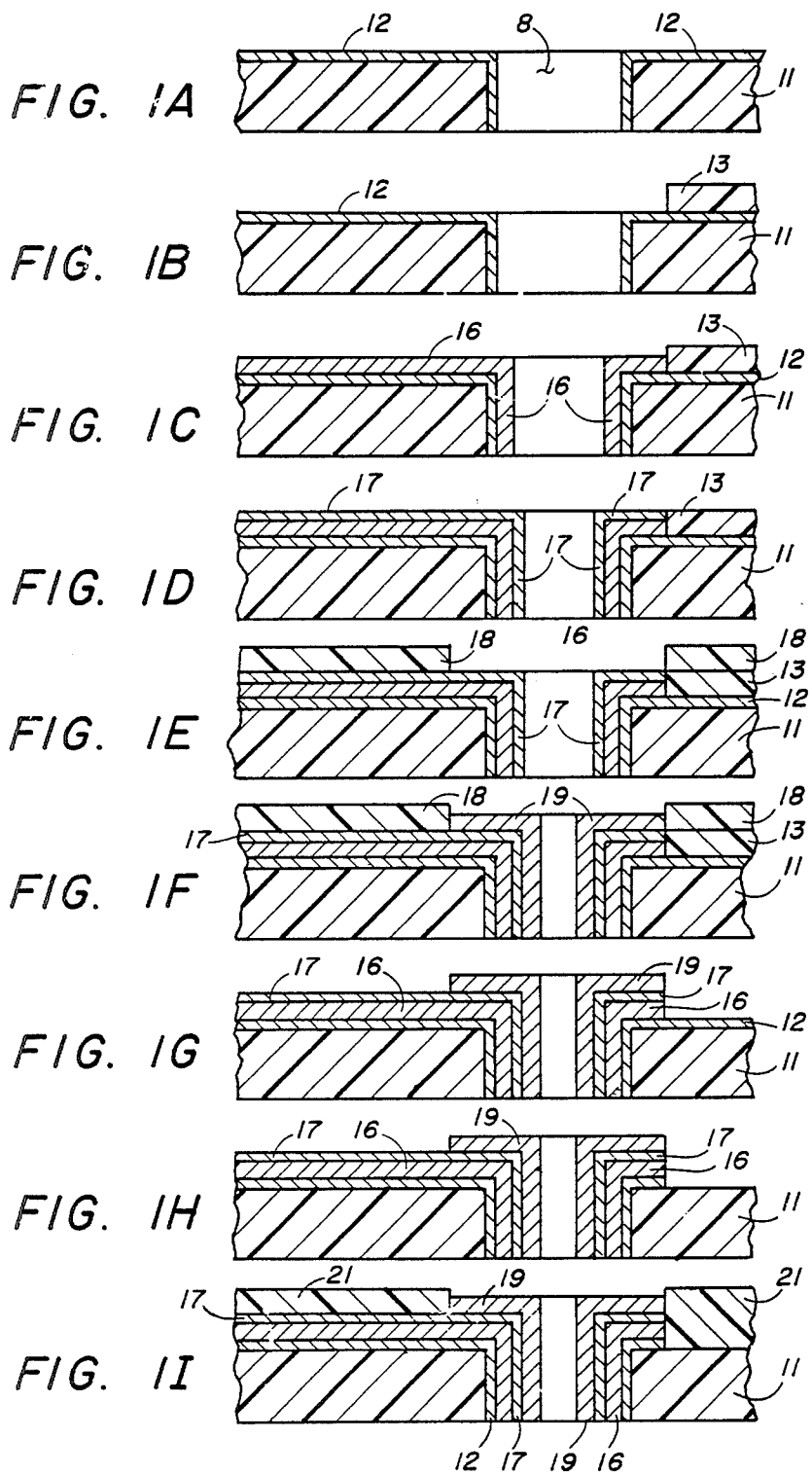
FIGS. 1A–1I are cross-sectional views of a portion of a printed circuit board at various stages of processing in accordance with this invention.
Figure 2:
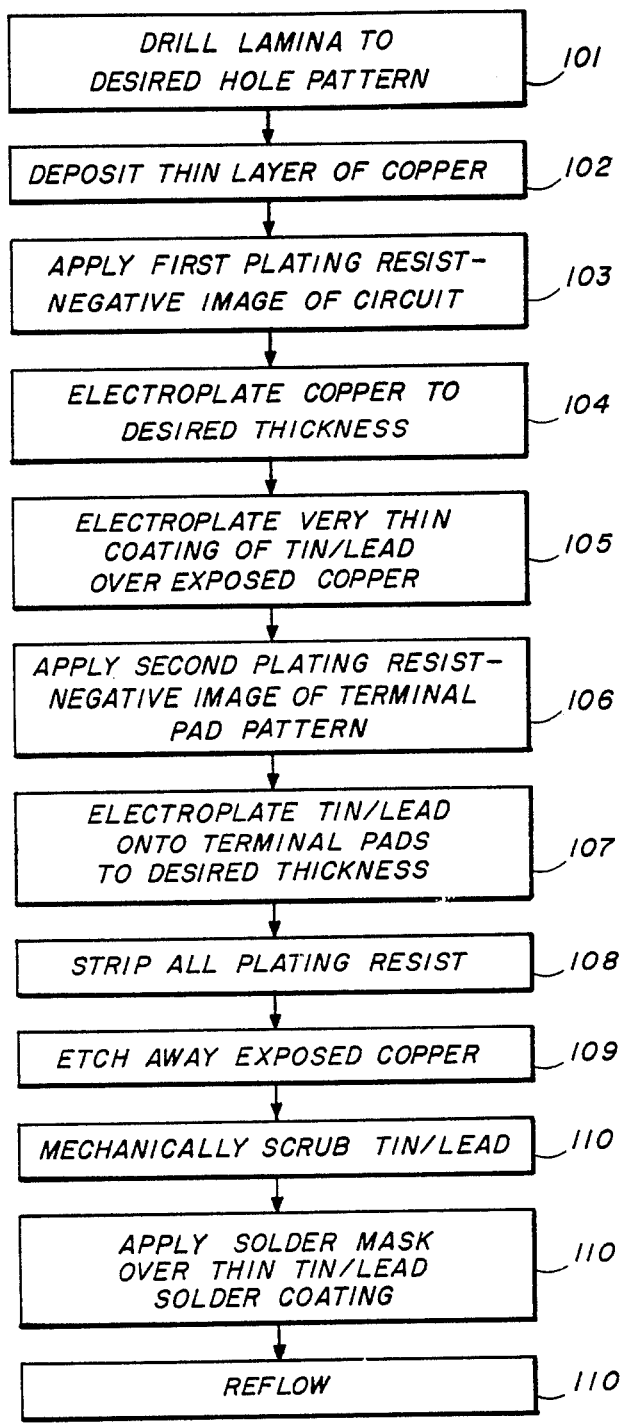
FIG. 2 is a table showing a sequence of process steps which may be followed in manufacturing a printed circuit board in accordance with this invention.

The representations of the printed circuit board in FIGS. 1 are greatly simplified and not drawn to scale for purposes of clarity of illustration and disclosure of the method of this invention. More specifically, the structure and electrical circuit patterns of the circuit board behind the holes 8 are not shown, and the thickness of the various coatings are greatly exaggerated and are not shown in the desired proportions. In the following description, necessary art work for and conventional steps of FIG. 2 that are normally used in the manufacture of a printed circuit board are not described in detail since they are well known in the prior art.

Referring now to FIG. 1A, holes 8 for the purpose of this description shall include all holes that require plating through such as component holes and via holes. Holes 8 are drilled through substrate 11 in a prescribed hole pattern (step 101) and a thin layer 12 of copper is chemically deposited on one or both sides of the substrate and walls of the holes 8 to make them electrically conductive (step 102). Alternatively, the substrate may have 1 ounce copper cladding bonded to one or both sides thereof prior to drilling component holes 8 and chemically depositing a thin layer of copper on the board and the walls of the holes (step 102) for making them conductive. One ounce copper refers to a copper foil that weighes one avoir ounce per square foot and has a nominal thickness of 0.0014". A relatively thick layer 13 of plating resist is then applied over the full surface areas of the copper in a negative image of the desired electrical circuit pattern (see FIG. 1B and step 103). After appropriate curing of the plating resist, an additional layer 16 of copper is electroplated onto the exposed areas of copper 12 to build them up to the full-required thickness, as dictated by electrical circuit requirements (see FIG. 1C and step 104).

In accordance with one aspect of this invention, a very thin coating 17 of tin-lead solder alloy is then deposited on the exposed copper surfaces of the board (see FIG. 1D and step 105). The coating 17 has a thickness which is sufficient to effectively operate as a metallic etch resist for the copper 12 that it covers, but which is thin enough that it will not melt and flow detrimentally during a subsequent wave soldering operation. By not flowing detrimentally, it is meant that any flow of the thin layer 17 of tin-lead solder will be insufficient to cause bridging or wrinkling and/or rupture of a solder mask on top of it. It is believed there is no melting or flowing of the coating 17, but there appears to be a sintering of the solder 17 into the copper traces during a subsequent reflow operation or wave solder operation. The composition of the tin-lead alloy is at least similar to and is preferably the same as that used in the subsequent wave soldering operation. By way of example, the solder of layer 17 may be 63% tin and 37% lead. The thin coating 17 is preferably electroplated onto the copper 12 in order to more precisely control the thickness thereof. In a circuit board that was manufactured in accordance with this invention, the thin coating 17 satisfactorily performed its intended functions when the thickness thereof was between 0.020 milli-inch and 0.050 milli-inch. In contrast, the subsequent conventional layer of solder (see coating 19 in FIG. 1F) that is located in and around the holes for improving the solderability there has a thickness of approximately 0.300 to 0.500 milli-inch, which is nearly an order of magnitude greater then the thickness of the thin protective layer 17.

A second layer 18 of plating resist is then deposited over the first layer 13 of plating resist and areas of the circuit pattern other than terminal pads and component holes (see FIG. 1E and step 106), the latter requiring a relatively thick coating of solder to ensure good solderability of circuit components in a subsequent wave soldering operation. This second layer 18 of plating resist is readily applied using the already existing art work for the solder mask. After cleaning and activating the exposed-thin area 17 of tin-lead solder alloy in and around the holes, the thick layer 19 of tin-lead is built up by electroplating to a desired thickness in the area of 0.300 to 0.500 milli-inches (see FIG. 1F and step 107). The composition of the solder plating used in this electroplating operation may also be the same as that used in the subsequent wave solder operation. Both of the layers 13 and 18 of plating resist are now chemically stripped from the board (see FIG. 1G and step 108). In order to remove excess copper which is not part of a desired electrical circuit pattern, the board is then immersed in or sprayed with an etchant solution for removing copper that is not covered and protected by the tin-lead overplatings 17 and 19 which operate as an etch to the copper under them (see FIG. 1H and step 109). The etchant is selected to be one that has little affect on the tin-lead alloy but which readily dissolves copper.

In accordance with another aspect of this invention, the circuit board in FIG. 1H is next cleaned, rinsed, acid dipped, rinsed and then mechanically-abrasively scrubbed for cleaning and roughening the surface of and reducing the thickness of the thin layer 17 of tin-lead (step 110). The mechanical scrubber may be a conventional commercially available machine such as the model 107 which is manufactured by CHEMCUT and may have an integral drying facility. Abrasive rollers of the scrubber should be cleaned periodically so that they do not contaminate the surface of the board. It is not necessary for the thin layer 17 of tin-lead to be completely removed from the copper. Preferably the abrasive scrubbing cleans and roughens the surface of the solder coating 17, and only removes surface amounts of that solder. Rather, it is preferable that the copper traces under the coating 17 not be exposed since this introduces a cosmetic defect. Additionally, such an amount of scrubbing may damage the copper traces since it has been found that the solder coating 17 actually sinters or soaks into or amalgamates with the copper under it during a subsequent reflow operation. In practice, it has been found that a thin layer 17 of tin-lead may actually be left on the board, omitting the scrubbing operation, without serious adverse affects.

In accordance with a further aspect of this invention, a solder mask 21 of a solder-resist is then applied to the surface of the board. The solder mask is preferably applied subsequent to heating of the board for eliminating any moisture left on it during cleaning and prior to reflow or fusing of the thick tin-lead layer 19. The mask itself is conventional and is applied in the desired thickness and cured in the manner well known in the prior art. The solder mask provides an overall printed wiring board that is esthetically pleasing and is a conformal-protective coating. The solder mask is preferably applied prior to reflow so that if fusing is accomplished by dipping the board in a hot oil bath, then oil and other contaminants will not be located on the areas of the board that are subsequently to be coated with solder-resist. In this sequence of operations, the solder mask also prevents bridging during wave soldering, reduces the solder content and spiking in large ground plane areas, and prevents cross over between closely spaced circuit traces. Also, this sequence of processing causes the solder mask to bond more firmly to the circuit board.

Finally, the tin-lead overplating 19 in the areas of the holes and contacts is fused by exposing the board to a sufficiently high temperature in the conventional manner (step 112). This fusing provides a shiny surface to the layer 19 and eliminates deformities such as striations in the solder layer 19 which may be subsequently contaminated by oil from the fingers of a human operator. Following the reflow operation, conventional fabrication operations are completed and then the completed printed wiring board in FIG. 1I is stored until it is loaded with components which may be attached thereto by a wave solder operation. It has been shown in tests and production runs that any flow of the thin solder coating 17 under the solder mask 21, at wave soldering temperatures, is insufficient to cause bridging or cause noticeable wrinkling and/or rupture of the solder mask.

What is claimed is:

1. In a method of fabricating a printed circuit board having a solder mask over at least a portion of other than pads and holes therethrough of a prescribed electrical circuit pattern in conductive material on the circuit board, the improvement comprising the step of providing on at least some of the portion of the conductive material a thin coating of metallic etch resist which is a tin-lead solder alloy and is of a thickness that is insufficient for it to flow detrimentally at the temperature of solder used in a subsequent operation such as wave soldering of the PC board assembly; the tin-lead etch resist not being chemically removed from said portion of the conductive material prior to its being covered by the solder mask.

2. The improvement according to claim 1 wherein said providing step comprises electroplating a thin coating of a tin-lead alloy over portion of the conductive material.

3. The improvement according to claim 2 wherein said step of providing further comprises electroplating a thin coating of said tin-lead alloy on walls of holes and on the circuit pads, and including the additional step of overplating any holes and circuit pads with tin-lead for increasing the thickness thereof to an acceptable level.

4. The improvement according to claim 2 including the additional step of electroplating the tin-lead alloy in holes and on the circuit pads to a prescribed thickness.

5. The improvement according to claim 3 including the additional step of applying the solder mask over said portion of the board and said thin tin-lead coating prior to reflowing the solder overplating on the pads and holes.

6. The improvement according to claim 5 including the additional step of abrasive scrubbing the board for cleaning the latter and reducing the thickness of the still exposed thin coating of tin-lead prior to applying the solder mask.

7. The improvement according to claim 5 wherein the tin-lead alloy has a composition similar to that used in a soldering operation for attaching components to the circuit board.

8. The improvement according to claim 5 wherein said tin-lead alloy has a composition that is substantially the same as that used in a subsequent solder operation.

9. The improvement according to claim 1 wherein the thickness of the thin coating of tin-lead solder on circuit traces and any ground planes is between 20 microinches and 50 microinches.

10. In a method of fabricating a printed circuit board with a desired electrical circuit pattern having a solder mask over at least a portion of the circuit pattern other than pads and any plated through holes, from a board having a first conductive material on at least one side thereof and on the walls of any holes therethrough and including the steps of plating a tin-lead alloy of at least approximate eutectic composition of a desired thickness in areas of the first conductive material corresponding to pads and holes, providing a metallic etch resist over parts of the first conductive material corresponding to other than pads and holes of the pattern, etching away first conductive material so as to produce the deserved circuit pattern therein, and applying the solder mask to the circuit board, the improvement wherein said step of providing comprises providing a thin coating of the solder alloy over the prescribed portions of the conductive material in a thickness which is insufficient for it to flow detrimentally and/or noticeably at the temperature used in a subsequent operation such as wave soldering of the printed circuit board assembly; the thin coating of tin-lead not being removed from said portion of the conductive material prior to applying the solder mask to the circuit board.

11. The improvement according to claim 10 wherein said alloy is tin-lead of near eutectic composition and including the additional step of applying the solder mask over said portion of the board and said thin tin-lead coating prior to reflowing the solder overplating on the pads and holes.

12. The improvement according to claim 11 including the additional step of abrasive scrubbing the board for cleaning the latter and reducing the thickness of the still exposed thin coating of tin-lead prior to applying the solder mask.

13. The improvement according to claim 12 wherein said tin-lead alloy has a composition that is substantially the same as that used in a subsequent solder operation.

14. The method of manufacturing a printed circuit board from a dielectric substate having a first conductive material on surfaces thereof and walls of component holes extending therethrough, comprising the steps of:

coating the first conductive material with a first layer of plating resist in a negative image of a desired electrical circuit pattern;

plating a second conductive material onto exposed portions of said first conductive material, in those areas not covered by said first layer of plating resist as required for increasing the thickness of said conductive materials to a desired thickness;

plating a first coating of a tin-lead alloy of at least near eutectic composition, which also functions as a metallic etch resist, over the second conductive material;

coating the first layer of plating resist and tin-lead alloy with a second layer of plating resist that is registered to cover the desired circuit pattern and in a negative pattern of the desired terminal pads and connector areas and component holes whereby said areas and holes are left uncoated with plating resist;

plating a second coating of alloy in a desired thickness on uncovered areas of said first coating of alloy covering said conductive material and on the walls of component and via holes;

stripping the first and second layers of plating resist from the board;

chemically etching away only uncovered areas of the first conductive material so as to leave the alloy and conductive materials thereunder substantially intact and in the desired circuit pattern; and depositing a solder mask over the substrate and exposed areas of first eutectic alloy in a desired pattern which leaves any desired terminal pads, connector areas, ground planes, and plated through holes for components leads and via holes being exposed;

the thickness of said first coating of alloy being insufficient for it to flow detrimentally and cause bridging or wrinkling of the solder mask at the temperature of a subsequent operation such as wave soldering of the printed circuit board.

15. The method according to claim 14 wherein said alloy is a tin-lead alloy having a composition similar to that of solder that is used in a subsequent soldering operation.

16. The method according to claim 15 wherein said step of providing a first coating of alloy comprises the step of electroplating a tin-lead alloy over the second conductive material and on walls of holes for component leads in the desired circuit pattern.

17. The process according to claim 16 including the additional step of reflowing the exposed second coating of solder overplating on terminal pads and holes subsequent to applying the solder mask over portions of the board other than the terminal pads and connector areas and plated through holes.

18. The method according to claim 17 including the additional step of abrasive scrubbing the board for cleaning the latter and reducing the thickness of the first coating of tin-lead alloy prior to applying the solder mask thereto.

19. The process according to claim 18 wherein the thickness X of the first coating of solder on the circuit traces and ground planes, other than the pads, is 20 microinch $<X 50$ microinch.

20. The process according to claim 14 wherein the first and second conductive materials are copper.

21. The process according to claim 20 wherein the electroplated alloy is a tin-lead alloy of near eutectic composition that is similar to that used in a subsequent solder operation.

22. The process according to claim 21 wherein the tin-lead alloy is reflowed by application of heat to the board subsequent to applying the solder mask to the board.

23. The method according to claim 22 including the additional step of abrasive scrubbing the board for cleaning the latter and reducing the thickness of the first coating of tin-lead alloy prior to applying the solder mask thereto.

* * * * *